United States Patent [19]

Kuroki et al.

[11] Patent Number: 4,553,845
[45] Date of Patent: Nov. 19, 1985

[54] DEVICE FOR AND METHOD OF ALIGNING TWO BODIES

[75] Inventors: Yoichi Kuroki; Yukihiro Yoshinari, both of Kawasaki; Ryozo Hiraga, Yokohama, all of Japan

[73] Assignee: Canon Kabushiki Kaisha, Tokyo, Japan

[21] Appl. No.: 435,960

[22] Filed: Oct. 22, 1982

[30] Foreign Application Priority Data

Oct. 28, 1981 [JP] Japan ................................. 56-172457

[51] Int. Cl.⁴ ............................................. G01B 11/00
[52] U.S. Cl. ..................................... 356/400; 356/401
[58] Field of Search ............... 350/399, 400, 401, 386, 350/387; 250/548, 557, 566

[56] References Cited

U.S. PATENT DOCUMENTS

| | | | |
|---|---|---|---|
| 3,758,214 | 9/1973 | Mangelsdorf | 356/387 |
| 4,167,677 | 9/1979 | Suzki | 356/401 |
| 4,170,418 | 10/1979 | Aiuchi et al. | 356/400 |
| 4,408,885 | 10/1983 | Johannsmeier et al. | 356/401 |

OTHER PUBLICATIONS

Taylor, F. M., "Using a Laser Micrometer for Precision Control of Wire Diameter and Position on a CV Line", *Proceedings of the 13th 23rd International Wire and Cable Symposium,* Atlantic City, N.J., (Dec. 3–5, 1974).

*Primary Examiner*—R. A. Rosenberger
*Attorney, Agent, or Firm*—Fitzpatrick, Cella, Harper & Scinto

[57] ABSTRACT

An alignment apparatus for aligning a mask having a first mark comprising first mark elements and a wafer having a second mark comprising second mark elements different in width from the first mark elements, comprises a moving mechanism for moving the wafer, a sensor for detecting the first and second marks and putting out a detection signal stream, a signal processing circuit for receiving the detection signal stream, discriminating between the first mark elements and the second mark elements in accordance with their respective pulse widths and creating a discrimination signal and creating a spacing signal regarding a plurality of spacings between the first mark elements and the second mark elements, and a drive circuit for driving the moving mechanism in response to the discrimination signal and the spacing signal. When the first and second mark elements overlap each other or come close to each other and the signals of the two elements cannot be separated, the wafer is moved by a predetermined amount, whereafter detection of the marks is again effected.

12 Claims, 16 Drawing Figures

DEVICE FOR AND METHOD OF ALIGNING TWO BODIES

BACKGROUND OF THE INVENTION

1. Field of the Invention

This invention relates to a device for and a method of aligning two bodies, and more particularly to a device for and a method of aligning a mask and a wafer in a mask aligner used in the manufacture of semiconductor integrated circuits.

2. Description of the Prior Art

To align a mask and a wafer, there is known a system in which two or three groups of alignment marks are provided on the mask and wafer, respectively. These alignment marks are scanned by an emitted beam such as a laser beam or the like and the light energy scattered by the alignment marks is received and converted into an electrical signal stream. U.S. Pat. No. 4,167,677 teaches a system of this type. There is also known a system in which the images of alignment marks are picked up by a photosensor array or the image pickup tube of a television and the electrical signals thereof are processed to obtain an alignment signal.

The problems peculiar to the prior art will hereinafter be specifically described by using an example of the prior art.

Figure 1:
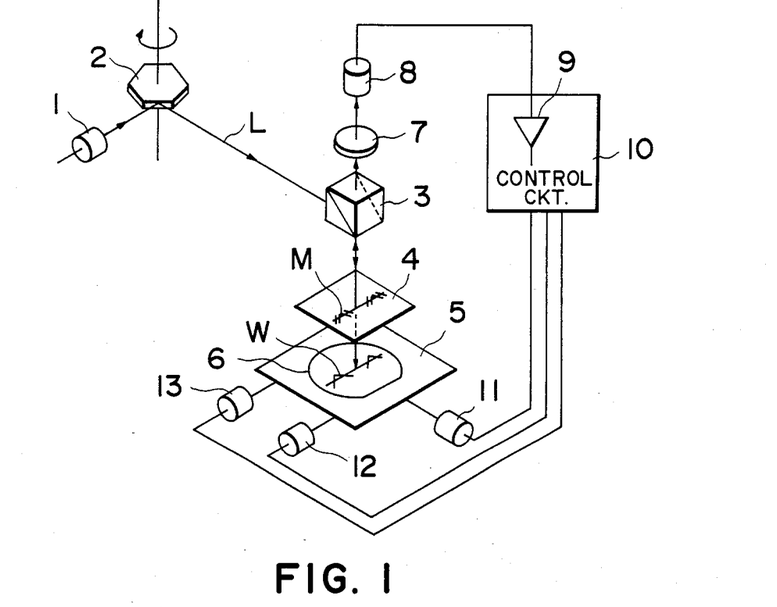
FIG. 1 shows the construction of the aligning apparatus according to the prior art.

The prior art device for aligning a mask and a wafer in the manufacture of semiconductors is constructed as shown, for example, in FIG. 1 of the accompanying drawings. The alignment marks M and W on a mask 4 held by a holder and a wafer 6 placed on a stage 5 are scanned by a laser beam L emitted from a laser light source 1, deflected by a polygon mirror 2 and a beam splitter 3, and the scattered lights from the alignment marks M and W are passed through a condenser lens 7 and photoelectrically converted and detected by a detector 8. From the output thereof, the amounts of displacement of the mask 4 and wafer 6 are calculated by a control circuit 10 having a comparator 9, and X-direction (the scanning direction of the beam or the direction of the scanning lines of the television) and Y-direction (a direction orthogonal to the X-direction) drive motors 11 and 12 and a rotational direction drive motor 13 are driven to move the stage 5, thereby accomplishing alignment.

Figure 2:
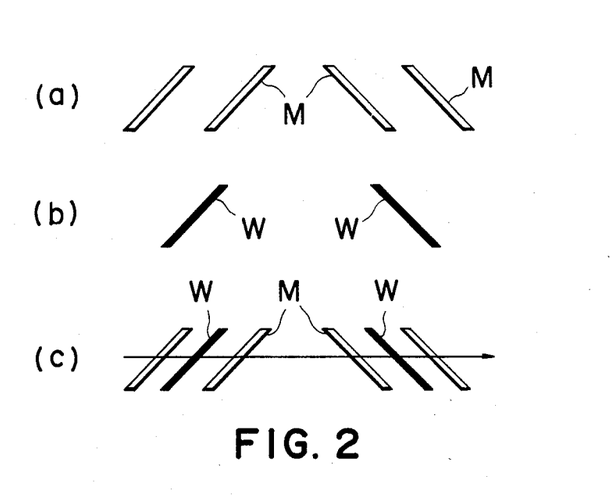
FIG. 2 illustrates the alignment marks of a mask and a wafer.
Figure 3:
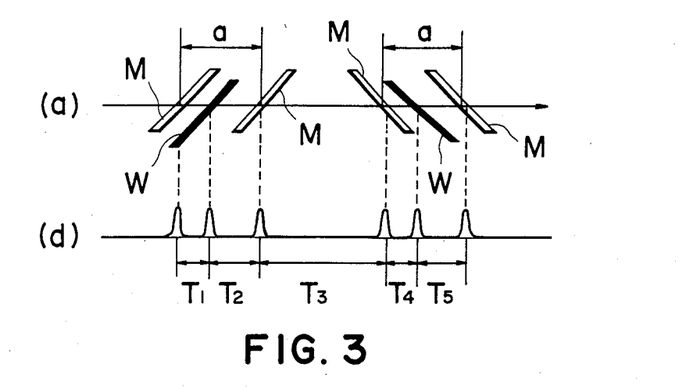
FIG. 3 illustrates a pulse signal obtained from alignment marks.
Figure 4:
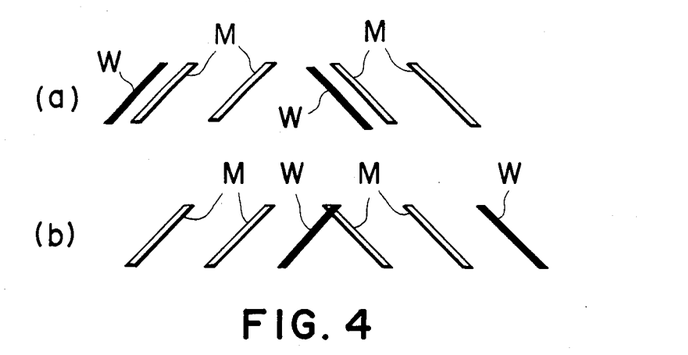
FIGS. 4 and 5 illustrate cases where there is a great amount of displacement between the alignment marks.
Figure 5:
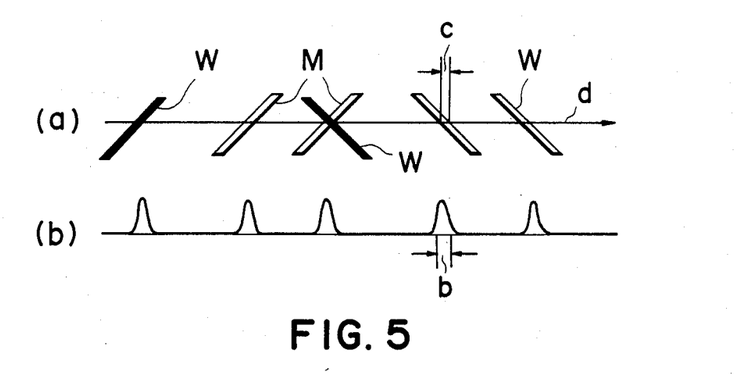

Assume, for example, that alignment marks M as shown at (a) in FIG. 2 of the accompanying drawings are depicted on the mask 4 and alignment marks W as shown at (b) in FIG. 2 are depicted on the wafer 6 and that these marks are aligned into a positional relation as shown at (c) in FIG. 2. In the apparatus of FIG. 1, when the alignment marks M and W are scanned in the direction of the arrow by the laser beam L, a signal as shown at (b) in FIG. 3 of the accompanying drawings which results from the scattered light based on the marks M and W which are in the positional relation shown at (a) in FIG. 3 is obtained from the detector 8 of FIG. 1. This signal is pulse-shaped by the comparator 9 and the spacings $T_1$–$T_5$ between the pulses are found, and from these spacings, the positional relation between the mask 4 and the wafer 6 is obtained, for thus effecting aligning. Generally, however, during the setting of the wafer 6, the marks W do not always lie between the marks M as shown at (a) in FIG. 3, but sometimes they are in the positional relation shown at (a) or (b) in FIG. 4 of the accompanying drawings and also, it is difficult to discriminate which of the obtained pulses is the signal from the mark M of the mask 4 and which of the obtained pulses is the signal from the mark W of the wafer 6. After the pulse train shown at (b) in FIG. 3 has been obtained, it is necessary to extract the features of the pulse train from the spacings between the pulses on the basis of the reference width a of the mark M of the mask 4 shown at (a) in FIG. 3 and to discriminate whether the positional relation between the mask 4 and the wafer 6 is in the condition shown at (a) in FIG. 3 or at (a) or (b) in FIG. 4. However, if, as shown at (a) in FIG. 5, the marks M and W of the mask 4 and wafer 6 overlap each other on the scanning axis d of the laser beam L, a signal is lost in the overlapping portion and the number of detected pulse signals is reduced as shown at (b) in FIG. 5. In this condition, it is difficult to find the positional relation between the mask 4 and the wafer 6 and therefore, in such a case, it is necessary to effect trial-and-error driving in which the mask and wafer are moved relative to each other by several tens of $\mu$m in X-direction and also by several tens of $\mu$m in Y-direction until the pulse signals are separated into six signals. Also, signals in the pulse signal detected by the detector 8, as shown in FIG. 5, the width b thereof has a time expance larger than the actual width c of the marks M, W due to the spot diameter, etc. of the laser beam L. Accordingly, where, as shown at (a) in FIG. 5, the marks M and W of the mask 4 and wafer 6 come close to each other within the signal width b if they do not overlap each other, the detection signals overlap each other and therefore, a pulse signal is lost and the trial-and-error driving becomes likewise necessary. However, if an attempt is made to make the alignment marks M and W smaller, the dimension a of the alignment marks M also becomes shorter and as a result, the marks M and W of the mask 4 and wafer 6 overlap each other or come close to each other, thereby increasing the probability with which the trial-and-error driving will need to be effected. Accordingly, if the marks M and W are made excessively small, there will arise a problem that the trial-and error driving is repeated to make aligning difficult or that much time is required for aligning.

SUMMARY OF THE INVENTION

It is a first object of the present invention to accurately align a plurality of bodies having alignment marks.

It is a second object of the present invention to discriminate, from a signal representing a detected mark, the mark of that body to which the signal is attributable.

It is a third object of the present invention to space, when mark elements forming the marks of the bodies have overlapped each other or have come close to each other, the mark elements apart from each other to thereby enable proper signal detection.

It is a fourth object of the present invention to detect an error in alignment between the bodies to be aligned in the direction of rotation thereof.

It is a fifth object of the present invention to obtain, in an apparatus or a method wherein the alignment marks on a mask and a wafer are scanned to thereby effect aligning of the mask and wafer, photoelectric pulse signals from the alignment marks of the wafer and mask and find an amount of movement for aligning by a predetermined operation formula on the basis of the measured pulse width and pulse spacing.

DESCRIPTION OF THE PREFERRED EMBODIMENTS

Figure 7:
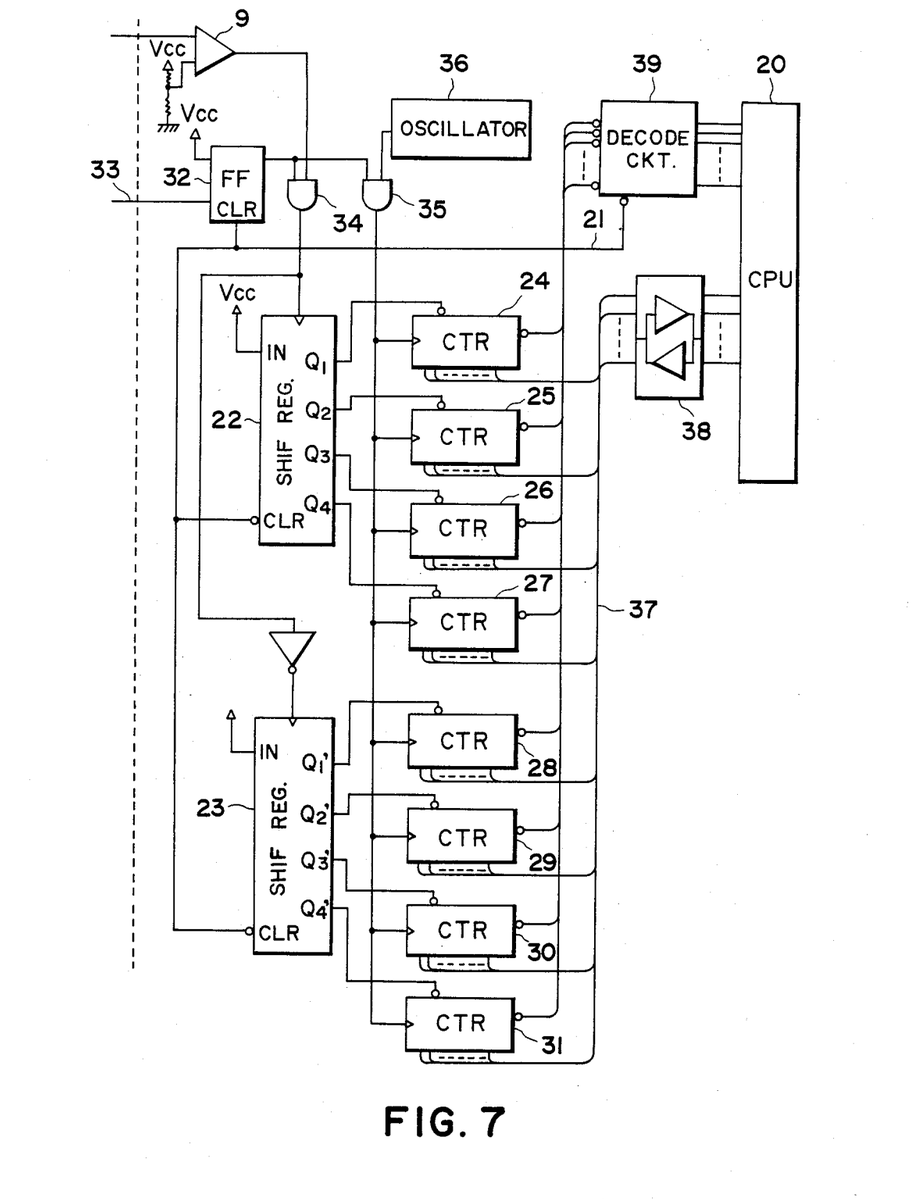
FIG. 7 shows a circuit construction for realizing the method of the present invention.

Referring to FIG. 7 which shows an example of the circuit of the present invention, an electrical signal input thereto is detected by the photoelectric detecting device depicted in FIG. 1.

Figure 6:
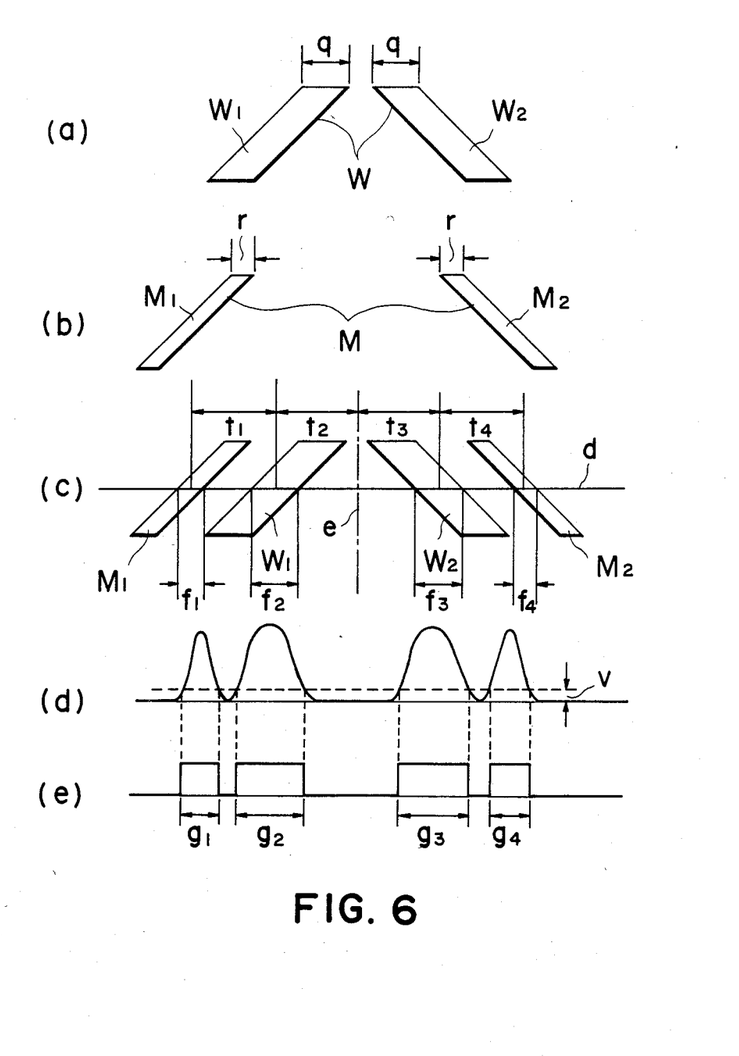
FIG. 6 illustrates signal processing.

FIG. 6(a) shows the mark elements $W_1$ and $W_2$ in the alignment marks W of a wafer 6, and FIG. 6(b) shows the mark elements $M_1$ and $M_2$ in the alignment marks M of a mask. The width q of the mark element $W_1$ and the width r of the mark element $M_1$ differ from each other to such an extent that they can be discriminated. FIG. 7 shows a circuit for introducing the signals from these alignment marks M and W into a CPU (central processing unit) in the control circuit 10 shown in FIG. 1 to realize the method according to the present invention. FIG. 6(c) shows the aligned state of the alignment marks M and W, and relative to the center e of the alignment mark elements $M_1$ and $M_2$ of the mask 4 on the scanning axis d of a laser beam L, the alignment marks M and W are aligned so that the spacings between centers of the mark elements $M_1$, $W_1$, $W_2$ and $M_2$ are $t_1=t_2=t_3=t_4$.

Figure 8:
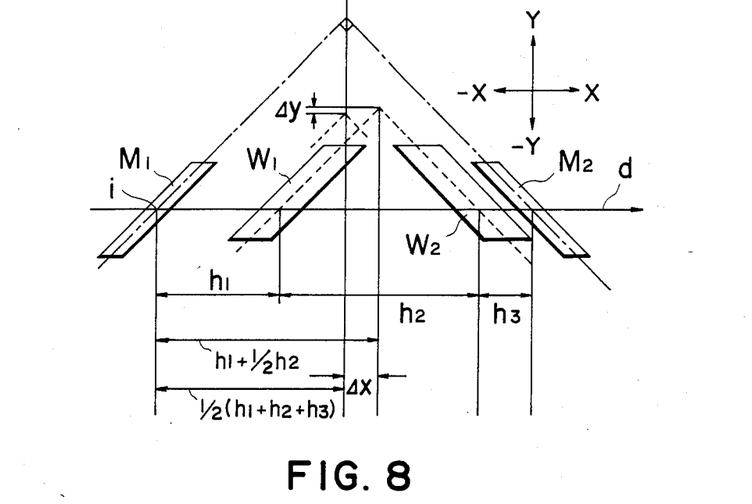
FIGS. 8 and 9 illustrate the relation between the signals obtained from the alignment marks.

The pulse signal put out from the detector 8 depicted in FIG. 1 becomes a signal as shown in FIG. 6(d) when the alignment marks M and W are in the aligned position or in a state approximate to the aligned position. If this is cut by a suitable slice level V in the comparator 9 shown in FIGS. 1 and 7, there are obtained pulse trains different in width as shown in FIG. 6(e). In FIG. 7, the CPU 20 first clears shift registers 22, 23, counter circuits 24–31 and a flip-flop circuit (hereinafter referred to as the FF circuit) 32 by a clear line 21 before measurement. Next, when a synchronizing signal arrives from the polygon mirror 2 via a signal line 33, the FF circuit 32 is set to open logical multiply gates 34 and 35. The counter circuits 24–27 are circuits for counting the rising positions of the pulse signals from the alignment marks M and W passed through the comparator 9, and the counter circuits 28–31 are circuits for counting the falling positions of said pulse signals. The counter circuits 24–31 start counting by the clock pulse of a clock oscillator 36 upon arrival of the synchronizing signal from the polygon mirror 2. The shift register 22 renders outputs $Q_1$–$Q_4$ into high level in succession upon each rising of the pulse signal from the comparator 9 and stops the counter circuits 24–27 in succession. The shift register 23 renders outputs $Q_1'$–$Q_4'$ into high level upon falling of each pulse signal and stops the counter circuits 28–31. In this manner, the counter circuits 24–27 store the rising position of each pulse signal and the counter circuits 28–31 store the falling position of each pulse signal. The CPU 20, after termination of a scanning of the laser beam L, reads out the stored values of the counter circuits 24–31 which have stored the rising and falling positions, through a data bus 37 and a driver circuit 38. Designated by 39 is a decode circuit for decoding the address control signal of the CPU 20. The spacings $t_1$–$t_4$ between the centers of the pulses are found from the values read out by the CPU while, at the same time, the pulse widths $g_1$, $g_2$, $g_3$ and $g_4$ of the pulses shown in FIG. 6(e) which are based on the mark widths $f_1$, $f_2$, $f_3$ and $f_4$ shown in FIG. 6(c) are found. The CPU 20 compares the pulse widths $g_1$, $g_2$, $g_3$ and $g_4$ and determines that the wider portions $g_2$ and $g_3$ are the signals of the alignment marks W of the wafer 6, and calculates the amounts of displacement and effects aligning. Here, it is assumed that as shown in FIG. 8, the spacings between the center points of the mark elements $M_1$ and $W_1$, $W_1$ and $W_2$, and $W_2$ and $M_2$ are $h_1$, $h_2$ and $h_3$, respectively. The amounts of displacement in this case are given by the following equations if, in case the alignment mark elements $W_1$ and $W_2$ of the wafer 6 lie inside the alignment mark elements $M_1$ and $M_2$ of the mask 4 as shown, for example, in FIG. 8, the center i of the signal of the leftmost mark element $M_1$ of the mask 4 is selected as the reference point, and the amount of displacement in X-direction is $\Delta x$ and the amount of displacement in Y-direction is $\Delta y$:

$$\Delta x = (\tfrac{1}{2})(h_1 + h_2 + h_3) - \{h_1 + (\tfrac{1}{2})h_2\} = (\tfrac{1}{2})(h_3 - h_1) \quad (1)$$

$$\Delta y = (\tfrac{1}{2})(h_1 + h_2 + h_3) - (\tfrac{1}{2})h_2 = (\tfrac{1}{2})(h_1 + h_3 - h_2) \quad (2)$$

Figure 9:
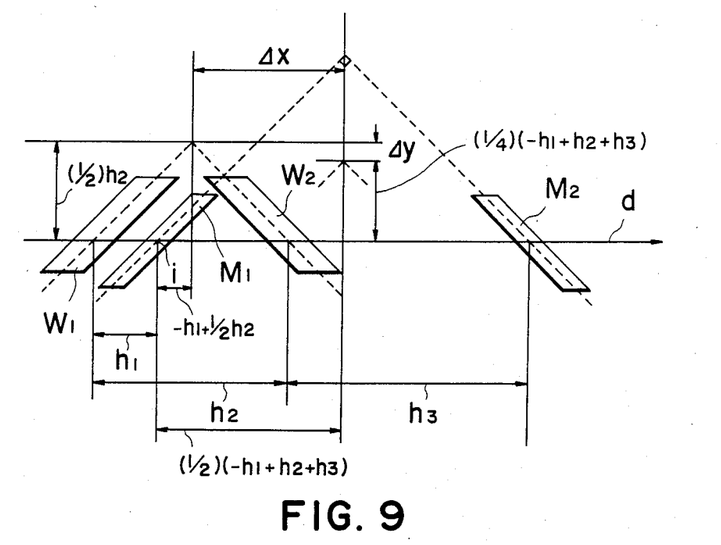

The positive and negative signs of the result of the calculation indicate the directions of the drives imparted to the stage 5 through the motors 11 and 12 for effecting aligning. Even in case the alignment mark element $W_1$ of the wafer 6 does not lie inside the alignment mark elements $M_1$ and $M_2$ of the mask 4 as shown in FIG. 9, if the signals of the alignment mark elements $M_1$ and $M_2$ of the mask 4 are separated as a pulse, the displacement can be found by equations (1) and (2) above with the point i as the reference.

Figure 10:
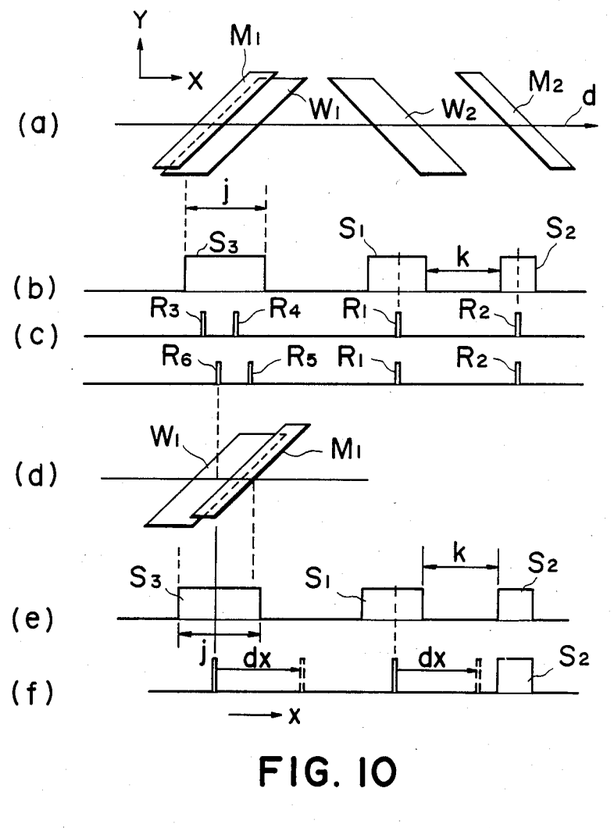
FIG. 10 illustrates the signal processing in case the alignment marks have overlapped each other.
Figure 11:
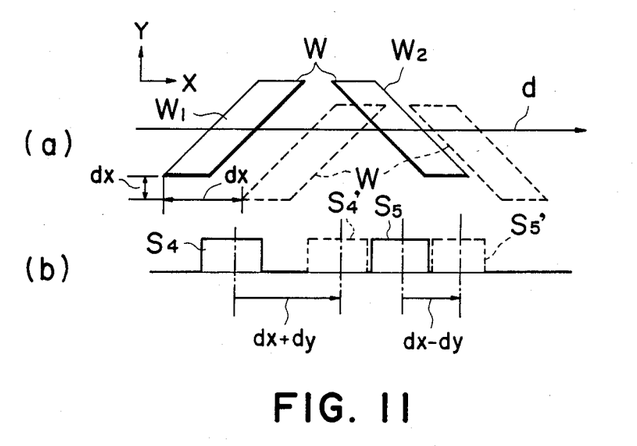
FIG. 11 illustrates the pulse signal in case the wafer has been moved.

If the alignment mark elements $M_1$ and $W_1$ of the mask 4 and wafer 6 overlap each other or come close to each other as shown in FIG. 10(a) and as a result, the detection signals overlap each other, signals as shown in FIG. 10(b) wherein a signal has been lost are detected. At this time, the signal $S_1$ of the mark element $W_2$ of the right-based wafer 6 and the signal $S_2$ of the mark element $M_2$ of the mask 4 are determined as the signals of the wafer 6 and mask 4 from their pulse widths and, as shown in FIG. 10(c), the center $R_1$ of the mark element $W_2$ of the wafer 6 and the center $R_2$ of the mark element $M_2$ of the mask 4 which correspond to these signals are found. However, as regards the left-hand overlapped signal $S_3$, it is not certain whether, as shown in FIG. 10(c), the center of the mark element $M_1$ of the mask 4 is $R_3$ and the center of the mark element $W_1$ of the wafer 6 is $R_4$, or whether the mark elements $M_1$ and $W_1$ overlap each other as shown in FIG. 10(e) and, as shown in FIG. 10(d), the center of the mark element $M_1$ of the mask 4 is $R_5$ and the center of the mark element $W_1$ of the wafer 6 is $R_6$. Therefore, if it is assumed that the center of the mark element $W_1$ of the wafer 6 is $R_6$, the wafer 6 may be moved to a position whereat the signal $S_3$ is separated, but it will be meaningless if the right-hand signals $S_1$ and $S_2$ overlap each other when the wafer is moved by dx in X-direction as shown in FIG. 10(f). The mark elements $M_1$, $M_2$, $W_1$ and $W_2$ are formed so that the center lines thereof are orthogonal to one another and thus, if, as shown in FIG. 11(a), the wafer 6 is moved and the mark W is moved by dx in X-direction and by "−dy" in Y-direction, the detection signal $S_4$ of the left-hand portion $W_1$ moves to $S_4'$ by dx+dy and the signal $S_5$ of the right-hand portion $W_2$ moves to $S_5'$ by dx−dy, both in X-direction, as shown in FIG. 11(b). Accordingly, in order that in the case of FIG. 10, the right-hand signals $S_1$ and $S_2$ may not overlap each other and the left-hand signal $S_3$ may be separated, the following relations should be satisfied:

$$dx+dy \geq j+l \quad (3)$$

$$dx-dy \leq k-l \quad (4)$$

where dx and —dy are the amounts of drive in X— and Y— directions, respectively, l is the minimum spacing for which two pulses can be electrically separated, j is the width of the overlapping pulse $S_3$ and k is the spacing between the right-hand signals $S_1$ and $S_2$. If the signs of inequality of formulas (3) and (4) are substituted for by a sign of equality and dx and dy are sought after, the following will be obtained:

$$dx=(\tfrac{1}{2})(j+k) \quad (5)$$

$$dy=(\tfrac{1}{2})(j-k)+l \quad (6)$$

That is, in case the signals overlap each other as shown in FIG. 10(b), the wafer 6 is driven in X- and Y-directions by the amounts given by equations (5) and (6) on the basis of the width j of the overlapped signals and the spacing k between the signals which do not overlap each other, whereby the signal $S_3$ can be separated. In this condition, the mask 4 and wafer 6 are in the positional relation as shown in FIG. 8 and therefore, if a signal is again introduced, precise aligning becomes possible by the aforementioned equations (1) and (2). The l used in formulas (3) and (4) is the necessary spacing for electrically separating a continuous pulse into two pulses and, in case the scanning speed of the laser beam is 2.5 μm/μs on the surface of the wafer 6, it will suffice if the spacing l is 0.25 μm and the time as the electrical signal is 100 ns. Although the foregoing example is a case where the left-hand portions $M_1$ and $W_1$ of the marks M and W overlap each other, the pulse can of course be likewise separated in case the right-hand portions $M_2$ and $W_2$ overlap each other.

Figure 12:
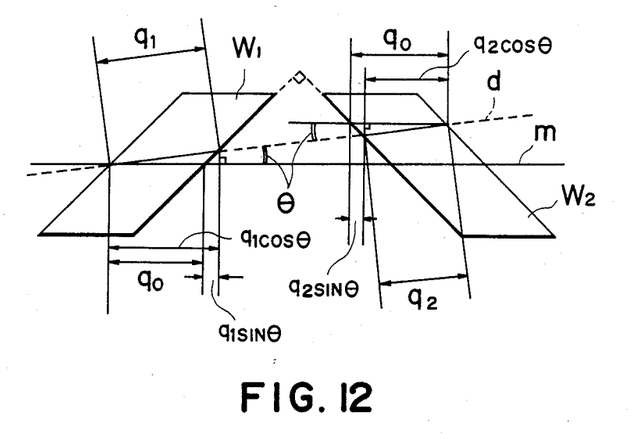
FIG. 12 illustrates a case where the wafer has been inclined.

As regards the alignment marks M and W shown in FIG. 6, the error in the direction of rotation relative to the scanning axis of the laser beam L can also be found and this will hereinafter be described. FIG. 12 shows a case where the wafer 6 is inclined by an angle θ relative to the scanning axis d of the laser beam L, and it is assumed that the scanning axis of the laser beam L when the error θ in the direction of rotation is zero is m. If the distance or the signal width over which the laser beam L when the rotation error θ is zero crosses the alignment mark elements $W_1$ and $W_2$ is $q_0$ and the distances or the signal widths when the laser beam L is inclined by an angle θ are $q_1$ and $q_2$, $$q_1\cos\theta - q_1\sin\theta = q_0 \quad (7)$$

$$q_2\cos\theta + q_2\sin\theta = q_0 \quad (8)$$

If θ is sufficiently small, $$q_1(1-\theta)=q_0 \quad (9)$$

$$q_2(1+\theta)=q_0 \quad (10)$$

$$\therefore \theta=(q_1-q_2)\div(q_1+q_2) \quad (11)$$

and the error of the wafer 6 in the direction of rotation is calculated from equation (11). Also, regarding the mark M of the mask 4, in case the laser beam L is inclined, the angle of inclination θ thereof can be likewise found. Accordingly, by imparting a movement for correcting this angle of inclination θ to the stage 5 through the motor 13, the aligning of the angle becomes possible.

Figure 13:
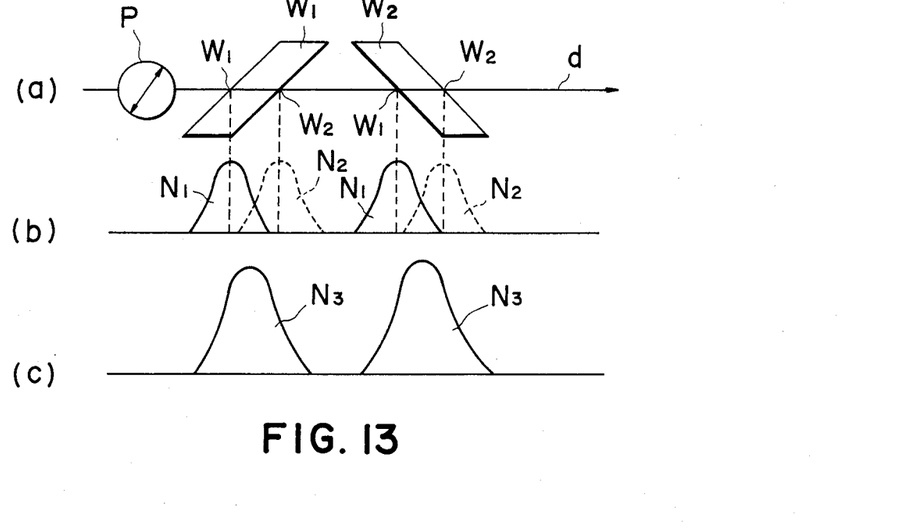
FIG. 13 is an enlarged view of a scattered light obtained from an alignment mark.
Figure 14:
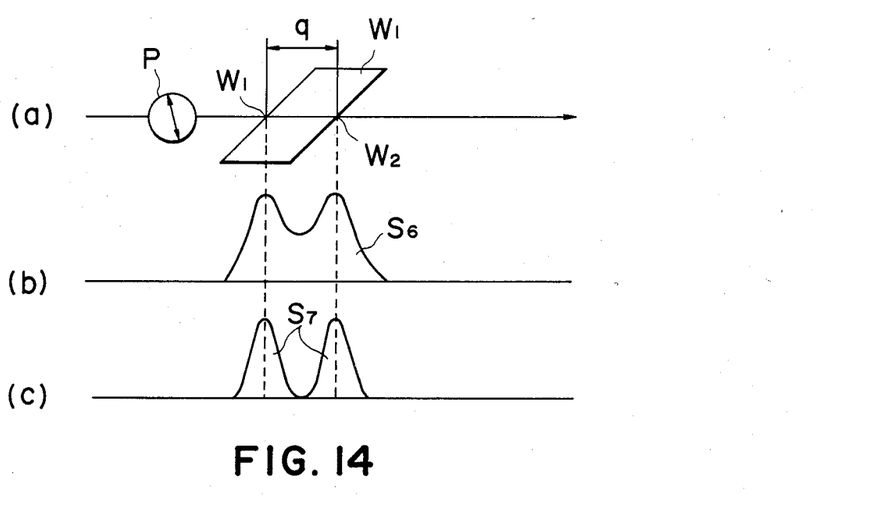
FIG. 14 is an enlarged view of a pulse signal obtained from an alignment mark.
Figure 15:
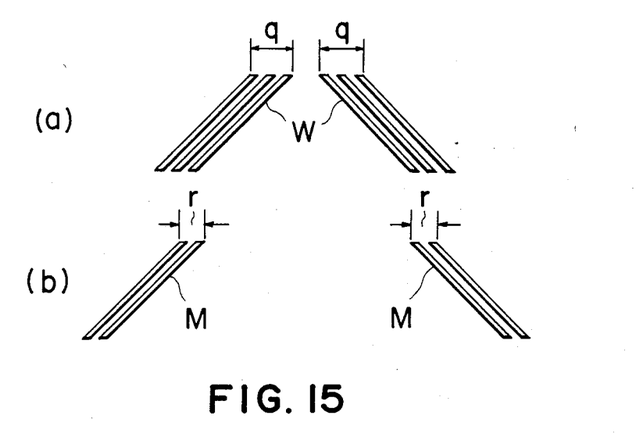
FIG. 15 is a plan view of alignment marks constituted by a collection of lines.

The detection signal when scanning is effected by the laser beam L is the sum $N_3$ of the scattered light $N_1$ from the left-hand edge $w_1$ of the alignment mark W and the scattered light $N_2$ from the right-hand edge $w_2$ of the alignment mark W, as shown in FIG. 13. p is the spot of the laser beam L. Accordingly, in case the diameter of the spot p of the laser beam L is not sufficiently great relative to the width q of the pattern as is shown in FIG. 14(a), there occurs a phenomenon that the end of the detected pulse signal $S_6$ is divided as shown in FIG. 14(b) or the detection signal is separated into the two pulses $S_7$ from the opposite edges $w_1$ and $w_2$ of the mark element $W_1$ as shown in FIG. 14(c). Where scanning is effected by the laser beam L in determining the widths q and r of the marks W and M shown in FIGS. 6(a) and (b), the diameter of the spot p thereof must also be taken into account. When the diameter of the spot p of the laser beam L cannot be made sufficiently great relative to the widths q and r, if thin lines are juxtaposed over an amount corresponding to the width q or r as shown in FIGS. 15(a) and (b), there will be obtained an effect similar to that of the patterns of FIGS. 6(a) and (b).

Figure 16:
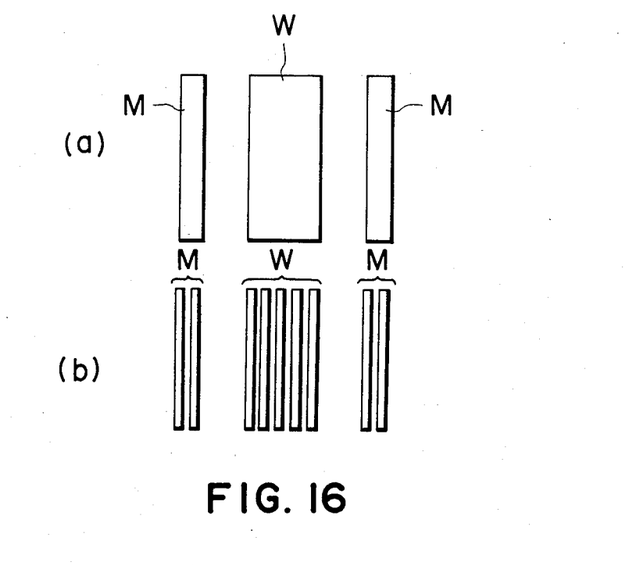
FIG. 16 is a plan view of another embodiment of the alignment marks.

In the aforedescribed embodiment, the alignment marks M and W of the mask 4 and wafer 6 are scanned by the spot p of the laser beam L, whereas the light source which scans the marks is not restricted to the spot but a laser sheet beam or the like may also be used. Further, even in case the detecting system comprises a two-dimensional detecting element, a two-dimensional sensor, a vidicon or the like, the method according to the present invention may be applied to the signal in the one-dimensional direction thereof, whereby the signals of the mask and wafer can be easily discriminated. In the case of a two-dimensional element, if the signal in the one-dimensional direction thereof is integrated in the two-dimensional direction, the signal detection sensitivity will be further improved. The shapes of the alignment marks M and W of FIG. 6 are merely an example and, where the amount of displacement only in one direction should only be found, for example, where marks changed in detection direction are provided at several locations on the surface of the wafer, there is no problem even if use is made of the alignment marks M of the mask 4 and the marks W of the wafer 6 as shown in FIGS. 16(a) and (b). Also, the method of discriminating between the marks M and W of the mask 4 and wafer 6 can be realized not only by varying the widths of the alignment marks M and W of the mask 4 and wafer 6 as in the previously described embodiment, but also by moving the wafer 6, for example, and examining the variation signals at the positions forward and rearward thereof.

As described above, the mask and wafer aligning method according to the present invention is a method in which the pulse signals from the alignment marks of the mask and wafer are discriminated at each pulse thereof as to whether they are from the marks of the wafer or from the marks of the mask and the amount of deviation therebetween is found from the arranged condition thereof, whereby aligning is effected, and even in case the marks of the mask and wafer have overlapped each other, the position can be approximately found and a position in which the signals are separated, namely, a condition in which fine alignment can be effected, can be brought about by a single drive. Also, since there is no hindrance even if the alignment marks overlap each other during the setting of the wafer, the alignment marks can be made sufficiently small.

What is claimed is:

1. A device for aligning two bodies, comprising:
   holding means for holding a first body, said first body having thereon a first mark comprising at least one mark element;
   moving means for holding a second body and moving said second body relative to said first body in a plane, said second body having thereon a second mark comprising at least one mark element;
   mark detecting means for detecting said first mark on said first body and said second mark on said second body and putting out a detection signal steam comprising first and second mark signals respectively, representing at least one mark element comprising said first and at least one mark element comprising said second mark;
   discrimination means for receiving said detection signal stream and for putting out discrimination information based on discrimination of whether said first and second mark signals are in a desired distribution in said detection signal stream;
   processing means for receiving said detection signal stream and for putting out spacing information representing the spacing between at least one mark element comprising said first mark and at least one mark element comprising said second mark; and
   drive means for driving said moving means in accordance with said discrimination information and said spacing information.

2. A device according to claim 1, wherein the width of mark elements comprising said first mark is different from the width of mark elements comprising said second mark, and wherein said discriminating means discriminates between said first mark signal and said second mark signal by discriminating the difference in pulse width of pulses in the detection signal stream representing the respective mark elements of said first and second marks, said discriminating means producing said discrimination information on the basis of whether said first and second mark signals are distributed in a desired order in said signal stream.

3. A device according to claim 1, wherein said first mark has a plurality of first mark elements, said second mark has a plurality of second mark elements, and said drive means drives said moving means to move said second body by a predetermined amount when said discriminating means detects that a signal regarding one of said first mark elements and signals regarding said second mark elements have overlapped each other.

4. A device according to claim 3, wherein said mark detecting means scans said first mark and said second mark along a scanning direction to thereby detect said two marks, said first mark has a plurality of first mark elements, said second mark has a plurality of second mark elements, and said drive means drives said moving means to move said second body in said scanning direction and in a direction orthogonal to said scanning direction when said discriminating means detects that a signal regarding one of said first mark elements and signals regarding said second mark elements have overlapped each other.

5. A device according to claim 4, wherein one of said first mark elements forms a set with another first mark element having a direction orthogonal to the direction of said one first mark element, and one of said second mark elements forms a set with another second mark element having a direction orthogonal to the direction of said one second mark element.

6. A device according to claim 1, wherein said processing means calculates the alignment error of said first body and said second body in the directions of rotation thereof from a pulse width value of signals in said signal stream representing at least two mark elements of said first mark and a pulse width value of signals in said signal stream representing at least two mark elements of said second mark.

7. A method of aligning two bodies, comprising the steps of:
   detecting a first mark on a first body and a second mark on a second body, said first mark including at least one mark element and said second mark including at least one mark element;
   putting out, in response to said detection, a detection signal stream comprising first and second mark signals representing at least one mark element included in said first mark and at least one mark element included in said second mark respectively;
   producing discrimination information on the basis of discrimination of whether said first and second mark signals are in a desired distribution in detection signal stream;
   producing spacing information representing the spacing between one mark element included in said first mark and one mark element included in said second mark as represented by said first and second mark signals; and
   moving said first body and said second body relative to each other in accordance with said discrimination information and said spacing information.

8. A method according to claim 7, wherein said first body and said second body are moved relative to each other in a first direction and a direction orthogonal thereto when overlap of said first mark signal and said second mark signal occurs.

9. A method according to claim 7, further comprising the step of calculating the alignment error of said first body and said second body in the direction of rotation thereof from signals regarding a plurality of said first mark elements and signals regarding a plurality of said second mark elements.

10. A method accoding to claim 7, wherein the width of mark elements comprising said first mark is different from the width of mark elements comprising said second mark and wherein said discrimination information is produced on the basis of the discrimination between said first and second mark signals by the difference in width of pulses in the detection signal stream representing the respective mark elements of said first and second marks and the discrimination of whether said first and second detection signals are distributed in a desired order in said detection signal stream.

11. A method according to claim 7, wherein the detection of said first and second marks is effected by scanning said marks with a beam.

12. A method according to claim 11, wherein the relative ratios between sizes of the diameter of the beam and the widths of said elements comprising said first and second marks are set so that the edges and portion of each mark signal between said edges may not be separated.

* * * * *